US012522918B2

(12) United States Patent
La et al.

(10) Patent No.: US 12,522,918 B2
(45) Date of Patent: Jan. 13, 2026

(54) SUBSTRATE PROCESSING METHOD

(71) Applicant: ASM IP Holding B.V., Almere (NL)

(72) Inventors: DooHyun La, Suwon-si (KR); KyungEun Lee, Suwon-si (KR); HakJoon Lee, Seoul (KR); YoonKi Min, Hwaseong-si (KR); HaRim Kim, Hwaseong-si (KR); DongHyun Ko, Hwaseong-si (KR); Seongil Cho, Cheonan-si (KR)

(73) Assignee: ASM IP Holding B.V., Almere (NL)

( * ) Notice: Subject to any disclaimer, the term of this patent is extended or adjusted under 35 U.S.C. 154(b) by 607 days.

(21) Appl. No.: 17/962,859

(22) Filed: Oct. 10, 2022

(65) Prior Publication Data

US 2023/0110980 A1 Apr. 13, 2023

Related U.S. Application Data

(60) Provisional application No. 63/255,228, filed on Oct. 13, 2021.

(51) Int. Cl.

| | |
|---|---|
| ***C23C 16/455*** | (2006.01) |
| ***C23C 16/44*** | (2006.01) |
| ***C23C 16/505*** | (2006.01) |
| ***C23C 16/56*** | (2006.01) |

(52) U.S. Cl.

CPC .... *C23C 16/4408* (2013.01); *C23C 16/45536* (2013.01); *C23C 16/45553* (2013.01); *C23C 16/505* (2013.01); *C23C 16/56* (2013.01)

(58) Field of Classification Search

CPC ................ C23C 16/515; C23C 16/505; C23C 16/45536; C23C 16/45523; C23C 16/45553; C23C 16/045

See application file for complete search history.

(56) References Cited

U.S. PATENT DOCUMENTS

| | | | | |
|---|---|---|---|---|
| 5,344,792 | A * | 9/1994 | Sandhu | C23C 16/42 438/681 |
| 5,888,591 | A * | 3/1999 | Gleason | C23C 16/463 427/255.6 |
| 8,465,811 | B2 | 6/2013 | Shintaro | |
| 8,647,722 | B2 | 2/2014 | Kobayashi | |
| 10,378,106 | B2 | 8/2019 | Kobayashi | |

* cited by examiner

*Primary Examiner* — Joseph A Miller, Jr.

(74) *Attorney, Agent, or Firm* — Snell & Wilmer L.L.P.

(57) ABSTRACT

A substrate processing method capable of forming a film with an improved step coverage on a surface of a gap structure having a high aspect ratio includes: providing a gap structure having a first step and a second step portion; supplying gas including a source gas onto the gap structure; generating active species from the source gas; generating neutral molecules by neutralizing the active species, and moving the neutral molecules in a direction toward a lower surface of a recess extending between the first stepped portion and the second stepped portion; and exciting the neutral molecules moving in the direction toward the lower surface.

18 Claims, 17 Drawing Sheets

SUBSTRATE PROCESSING METHOD

CROSS-REFERENCE TO RELATED APPLICATIONS

This application claims priority to U.S. Provisional Patent Application Ser. No. 63/255,228 filed Oct. 13, 2021 titled SUBSTRATE PROCESSING METHOD, the disclosure of which is hereby incorporated by reference in its entirety.

BACKGROUND

1. Field

One or more embodiments relate to a method of processing a substrate including a recess area, and more particularly, to a method of forming a film having a uniform thickness on a gap structure.

2. Description of the Related Art

As the degree of integration of semiconductor devices increases, the aspect ratio (NR) of gap structures is also increasing. For example, as a depth of a gap structure increases compared to a width of an entrance of the gap structure, the technical difficulty of filling the gap structure without seams or voids is also increasing.

Atomic layer deposition (ALD) or plasma atomic layer deposition (PEALD) has the advantage that a film having a uniform thickness can be deposited on walls and bottom surfaces of a gap structure. However, because a source gas and a reactant gas are sequentially supplied and purged with a time difference, the substrate processing speed is slow.

On the other hand, in chemical vapor deposition (CVD) or plasma atomic layer deposition (PECVD), a source gas and a reactant gas are simultaneously supplied, and thus, the film formation rate and substrate processing speed are greater than those of the ALD, but there is a limitation in maintaining a uniform film thickness on a gap structure. When a gap is filled by using CVD, a film formation rate at an upper portion of a gap structure is higher, so that the entrance of the gap is closed before the inside of the gap is filled.

In particular, as the miniaturization of semiconductor devices is accelerated, an aspect ratio of a gap structure and a surface area inside a gap are increasing. Accordingly, in order to fill the gap structure by the conventional ALD, a supply time and a purge time of a source gas and a reactant gas are increased, and the substrate processing speed is decreased. The conventional CVD also has a large difference in a film formation rate between an upper area and a lower area of a gap structure, and the entrance of a gap is closed first, so that voids or seams remain inside the gap. In addition, in the case of an atomic layer deposition process or a chemical vapor deposition process using plasma, it is difficult for active species to reach a bottom surface of a gap, and the characteristics of films deposited on upper and lower areas of the gap are different, so that cracks may occur in a subsequent heat treatment process.

SUMMARY

One or more embodiments include atomic layer deposition and chemical vapor deposition in a gap-filling process. In more detail, one or more embodiments include a method capable of increasing a film formation rate while depositing a uniform thin film with an improved step coverage on the surface of a gap structure having a high aspect ratio (HAR).

One or more embodiments include forming a film of uniform characteristics over an upper area and a lower area of a gap structure having a higher aspect ratio.

One or more embodiments include suppressing the occurrence of voids inside a gap by maintaining a width of the entrance of the gap greater than the inside of the gap in a process of filling a gap structure having a higher aspect ratio.

Additional aspects will be set forth in part in the description which follows and, in part, will be apparent from the description, or may be learned by practice of the presented embodiments of the disclosure.

According to one or more embodiments, a substrate processing method includes: providing a gap structure having a first step and a second step; supplying gas including a source gas onto the gap structure; generating active species from the source gas; neutralizing the active species and generating neutral molecules , and moving the neutral molecules in a direction toward a lower surface of a recess extending between the first step and the second step; and exciting the neutral molecules that moved in the direction toward the lower surface.

According to an example of the substrate processing method, during the exciting of the neutral molecules, layer formation in a first area adjacent to the lower surface of the recess between the first step and the second step may be promoted.

According to another example of the substrate processing method, during the generating of active species from the source gas, layer formation in the second area adjacent to an edge of the first step and the second step may be promoted.

According to another example of the substrate processing method, a step coverage of the layer formed over the first area and the second area may be increased by exciting the neutral molecules and generating active species from the source gas.

According to another example of the substrate processing method, during the neutralizing of the active species, an edge potential formed at the edge of the first step and the second step may be reduced.

According to another example of the substrate processing method, while the neutral molecules move in the direction toward the lower surface, remaining active species may move in the direction toward the lower surface without being affected by the edge potential.

According to another example of the substrate processing method, the substrate processing method may further include applying plasma in a pulsed manner.

According to another example of the substrate processing method, during the applying of plasma, at least one of first frequency RF power of 13 MHz or more and second frequency RF power of 1 MHz or less may be applied.

According to another example of the substrate processing method, the applying of plasma in an operation of generating active species may include an ON period and an OFF period, during the ON period, the generating of active species from the source gas may be performed, and during the OFF period, the neutralizing of the active species may be performed.

According to another example of the substrate processing method, the exciting of the neutral molecules that moved in the direction toward the lower surface may be performed during the ON period.

According to another example of the substrate processing method, during the supplying of gas including a source gas, a reactant gas or a reactive purge gas may be supplied together with the source gas.

According to another example of the substrate processing method, the substrate processing method may further include a post-treatment.

According to another example of the substrate processing method, during the post-treatment, the supply of the source gas may be stopped.

According to another example of the substrate processing method, during the post-treatment, the layer may be densified.

According to another example of the substrate processing method, during the post-treatment, an overhanging portion of the layer may be removed.

According to another example of the substrate processing method, a RF power during the post-treatment may be greater than a RF power during the generation of active species from the source gas.

According to another example of the substrate processing method, a RF frequency during the post-treatment may be less than a RF frequency during the generation of active species from the source gas.

According to another example of the substrate processing method, a RF frequency during the post-treatment may further include a RF frequency supplied during the generation of active species from the source gas.

According to one or more embodiments, a substrate processing method includes: providing a gap structure having a first step and a second step; and supplying a gas including a source gas on the gap structure, wherein plasma is applied in a pulsed manner during the supply of a gas including a source gas, so that dissociated molecules of the source gas may be diffused in a direction toward a lower surface of the gap structure between the first step and the second step.

According to one or more embodiments, a substrate processing method includes: supplying a gas including a source gas onto a first step and a second step; generating active species from the source gas; and reducing an ion trajectory distortion of the active species by reducing an edge potential at edges of the first step and the second step.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
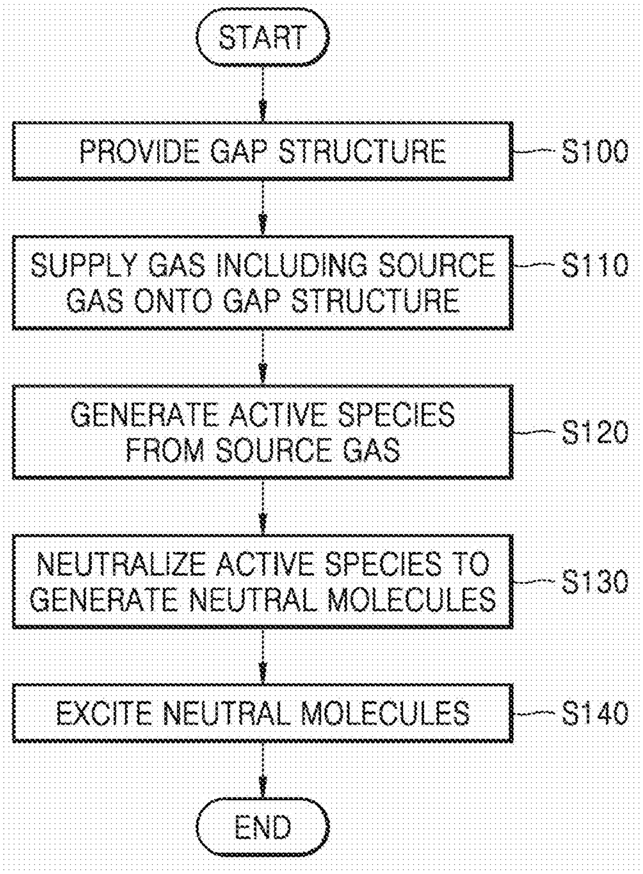
FIG. 1 is a flowchart of a substrate processing method according to embodiments.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

Hereinafter, embodiments of the disclosure will be described in detail with reference to the accompanying drawings.

In this regard, the embodiments may have different forms and should not be construed as being limited to the descriptions set forth herein. Rather, these embodiments are provided so that the disclosure will be thorough and complete, and will fully convey the scope of the disclosure to one of ordinary skill in the art.

The terminology used herein is for describing particular embodiments and is not intended to limit the disclosure. As used herein, the singular forms "a", "an", and "the" are intended to include the plural forms as well, unless the context clearly indicates otherwise. It will be further understood that the terms "includes", "comprises" and/or "including", "comprising" used herein specify the presence of stated features, integers, steps, processes, members, components, and/or groups thereof, but do not preclude the presence or addition of one or more other features, integers, steps, processes, members, components, and/or groups thereof. As used herein, the term "and/or" includes any and all combinations of one or more of the associated listed items.

It will be understood that, although the terms first, second, etc. may be used herein to describe various members, components, regions, layers, and/or sections, these members, components, regions, layers, and/or sections should not be limited by these terms. These terms do not denote any order, quantity, or importance, but rather are only used to distinguish one component, region, layer, and/or section from another component, region, layer, and/or section. Thus, a first member, component, region, layer, or section discussed below could be termed a second member, component, region, layer, or section without departing from the teachings of embodiments.

Embodiments of the disclosure will be described hereinafter with reference to the drawings in which embodiments of the disclosure are schematically illustrated. In the drawings, variations from the illustrated shapes may be expected because of, for example, manufacturing techniques and/or tolerances. Thus, the embodiments of the disclosure should not be construed as being limited to the particular shapes of regions illustrated herein but may include deviations in shapes that result, for example, from manufacturing processes.

FIG. 1 is a flowchart of a substrate processing method according to embodiments. FIGS. 2 to 5 are cross-sectional views of a substrate processed in each step in the substrate processing method illustrated in FIG. 1.

Figure 2:
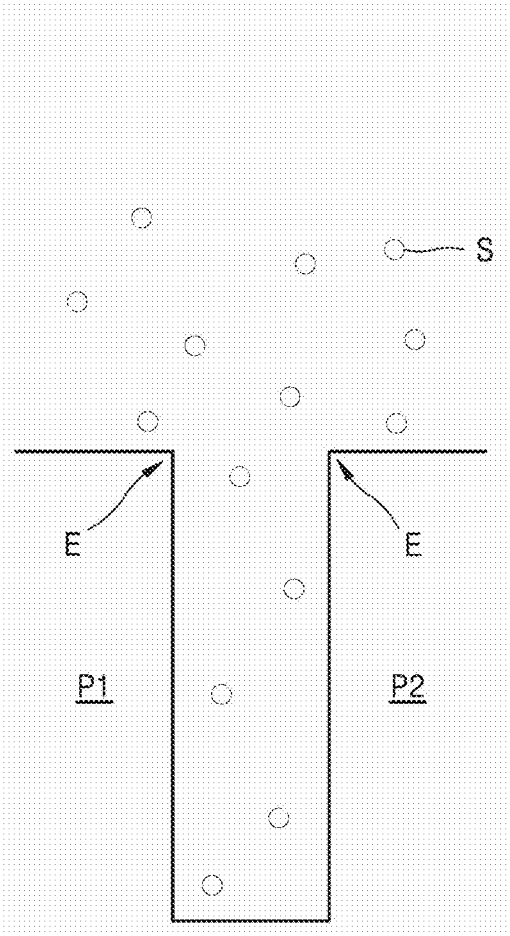
FIGS. 2 to 5 are cross-sectional views of a substrate processed in each step in the substrate processing method illustrated in FIG. 1.

Referring to FIGS. 1 and 2, first, in operation S100, a gap structure having a first protrusion P1 and a second protrusion P2 is provided. Each of the first step P1 and the second step P2 may have an edge portion E between an upper surface and a side surface. In addition, the edge portion E of the first step P1 and the second step P2 may have a certain curvature.

The gap structure is a non-planar structure and may include an upper surface, a lower surface, and a side surface connecting the upper surface and the lower surface. The gap structure may be used to form an active region, or may be used to form a gate pattern or a metal pattern. For example, when the gap structure is used in a through silicon via (TSV) process, the gap structure may be a structure in which at least two silicon substrates are stacked. In addition, a metal wire for electrical connection of silicon substrates may be formed in a recess formed by the first step P1 and the second step P2.

The gap structure may include a high aspect ratio gap, that is, a recess. The recess may be formed between the first step P1 and the second step P2. For example, the recess may have a depth of 1 to 100 micrometers and a width of 0.01 to 1 micrometer.

In another example, the gap structure may be formed on a substrate, which may be, for example, a semiconductor substrate or a display substrate. The substrate may include, for example, any one of silicon, silicon-on-insulator, silicon-on-sapphire, germanium, silicon-germanium, and gallium-arsenide.

Referring again to FIGS. 1 and 2, operation S110 of supplying a gas including a source gas S onto the gap structure is performed. The source gas S may include a precursor for layer formation. For example, when a silicon oxide layer and/or a silicon nitride layer are to be formed on the gap structure, the source gas S may include a silicon precursor. FIG. 2 illustrates a state in which a gas including the source gas S is supplied so that molecules of the source gas S are located on a gap structure.

The gas including the source gas S may include at least one of a purge gas and a reactant gas in addition to the source gas. In other words, during operation S110 of supplying the gas including the source gas, a purge gas and/or a reactant gas may be supplied together with the source gas. In another embodiment, the purge gas and/or the reactant gas may be supplied after operation S110 of supplying the gas including the source gas.

In some embodiments, the gas including the source gas S may include a reactive purge gas. The reactive purge gas may purge a reactor without reacting with the source gas S when it is not activated by plasma. On the other hand, when activated by plasma, the reactive purge gas may be excited/activated and chemically react with the source gas S, thereby forming a layer or a film.

Figure 3:
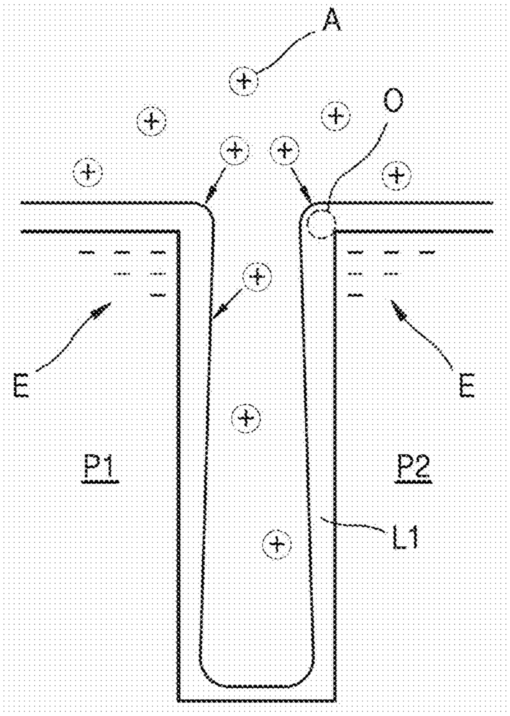

Referring to FIGS. 1 and 3, operation S120 of generating active species A from the source gas is performed. For example, dissociation of the source gas S (in FIG. 2) may be induced by applying energy such as heat or plasma. When plasma is used as energy, for example, RF power may be supplied. In some embodiments, the RF power may have, for example, a frequency of 13 MHz or higher. In an optional embodiment, two types of frequency power may be applied for plasma application. For example, first frequency power of 13 MHz or more and second frequency power of 1 MHz or less may be applied.

The plasma application may be performed by a substrate processing apparatus including a gas supply unit and a substrate support unit. The gas supply unit may be used as an electrode in a plasma process such as a capacitively coupled plasma (CCP) method. In the CCP method, the substrate support unit may also be used as an electrode, so that capacitive coupling may be achieved by a gas supply unit serving as a first electrode and a substrate support unit serving as a second electrode.

During operation S120, as source gas molecules are dissociated into electrons (not shown) of anions and active species A of cations, a first layer L1 based on the source gas S (in FIG. 2) may be formed. For example, when operation S120 is performed in the absence of a separate reactant gas or reactive purge gas, the first layer L1 based on the source gas molecules may be formed on upper surfaces and side surfaces of the first step P1 and the second step P2 and a lower surface connecting the first step P1 and the second step P2.

In some embodiments, a reactant gas (or reactive purge gas) may be supplied during operation S110, and in this case, the source gas molecules may react with the reactant gas or the reactive purge gas during operation S120. Accordingly, a layer based on a gaseous reaction between the source gas S (in FIG. 2) and the reactant gas may be formed on the gap structure.

In some embodiments, during operation S120 of generating active species from gases including a source gas, formation of the first layer L1 in an upper area adjacent to an edge of the first step P1 and the second step P2 may be promoted. The formation of the first layer L1 in the upper area may be promoted by edge potentials (shown with 6 '-' in FIG. 3) at the edge portion E of the first step P1 and the second step P2 respectively. A state in which the formation of the first layer L1 in the upper area is promoted is illustrated in FIG. 3, and the first layer L1 may include an overhang portion O.

In more detail, because a charge accumulates more in the sharp edge portion E than in a flat portion, an electric field applied between the gas supply unit and the substrate support unit of the substrate processing apparatus may be concentrated to the edge portion E of the gap structure. As a result, the active species A of cations also move toward the edge portion E, whereby the formation of the first layer L1 in the upper area adjacent to the edge portion E may be promoted, and the overhang portion O may be formed.

The first layer L1 on which the overhang portion O is formed may have a non-uniform thickness over the surface of the recess. For example, a thickness of the first layer L1 formed in an upper area of the recess may be greater than a thickness of the first layer L1 formed in a lower area of the recess. For example, when an average thickness of the first layer L1 in the upper 10% of the recess, formed after operation S120 of generating active species, is x1, and when an average thickness of the first layer L1 at the bottom 10% of the recess is x2, a ratio of both may be greater than 1, e.g. x1 over x2, which may be defined as a first thickness ratio.

Figure 4:
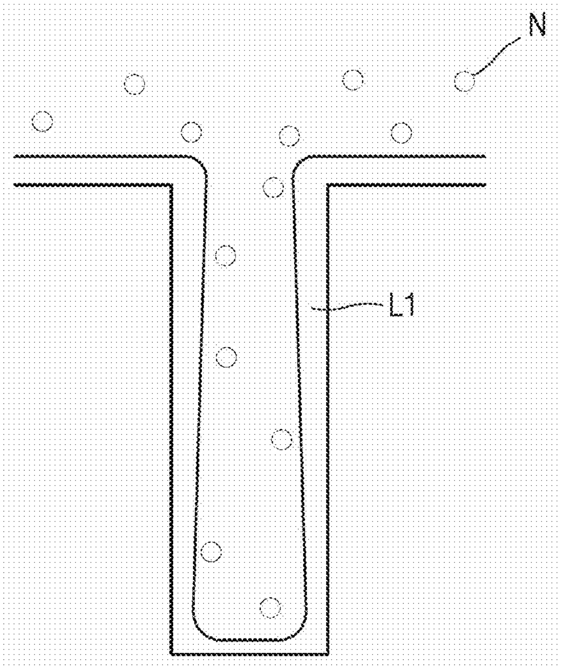

Thereafter, referring to FIGS. 1 and 4, operation S130 of neutralizing the active species to generate neutral molecules N is performed. During the neutralizing of the active species, an electric field that has been applied between the gas supply unit and the substrate support unit of the substrate processing apparatus may be removed. For example, by eliminating the plasma application in the substrate processing apparatus, an electric field of a substrate may be removed and the active species A (of FIG. 3) may be neutralized.

The neutral molecules N generated by neutralizing the active species may move in a direction toward the lower surface of the recess extending between the first step P1 and the second step P2 of the gap structure. The neutral molecules N may move toward the lower surface relatively freely compared to the active species A (in FIG. 3).

In more detail, the active species A as cations may be affected by an external electric field, whereas the neutral molecules N may not be affected by an external electric field. Even if an edge potential remains in the edge portion E of the first step P1 and/or the second step P2 of the gap structure, the neutral molecules N may move to the lower area of the recess without the influence of such an edge potential.

Further, in some optional embodiments, during the neutralizing of the active species A, the edge potential formed at the edge of the first step P1 and the second step P2 may be reduced. For example, by turning off plasma, the electric field that has been applied between the gas supply unit and the substrate support unit may be removed, and the edge potential may be reduced accordingly. In this case, the active species A of the remaining cations may become free from the influence of the edge potential.

For example, although only the neutral molecules N (and their movement into the lower area of the recess) are shown in FIG. 4, according to some embodiments, in addition to the neutral molecules N, the active species A may remain on the gap structure. In this case, due to the reduced edge potential described above, the remaining active species A may move to the lower area of the recess without the influence of an external electric field, so that an increase in mobility may be achieved.

In some embodiments, the movement of the neutral molecules N described above and the movement of the remaining active species A may be performed simultaneously. In this case, while the neutral molecules N move in the direction toward the lower surface of the recess, the remaining active species A may move in the direction toward the lower surface without being affected by the edge potential.

Figure 5:
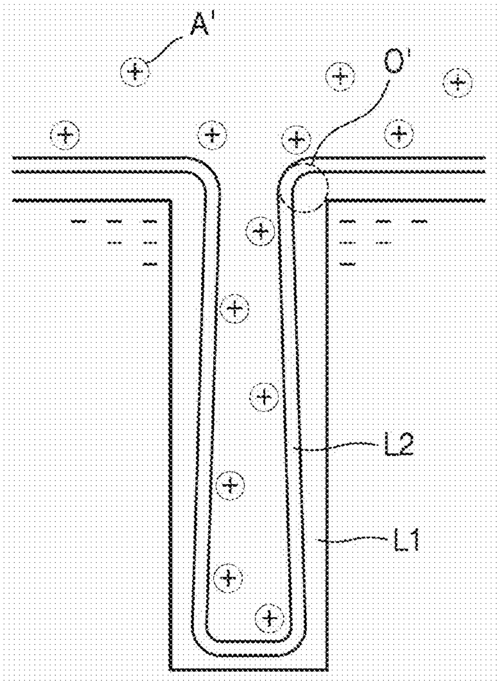

Thereafter, referring to FIGS. 1 and 5, operation S140 of exciting the neutral molecules N that has been moved in the direction toward the lower surface is performed. For this, for example, by turning on plasma, an electric field that has been applied between the gas supply unit and the substrate support unit may be generated. The neutral molecules N may be excited by the electric field to be separated again into electrons (not shown) and active species A'.

Because the neutral molecules N are excited after their movement in the direction toward the lower surface, the active species A' may be generated in the lower area of the recess. Consequently, during the exciting of the neutral molecules N, formation of a second layer L2 in the lower area adjacent to the lower surface of the recess between the first step P1 and the second step P2 may be promoted.

As described above, the formation of the first layer L1 in the upper area of the recess may be promoted during operation S120 of generating the active species A from gases including the source gas S, and the formation of the second layer L2 in the lower area of the recess may be promoted during operation S140 of exciting the neutral molecules N with the active species A'. Therefore, by performing these operations alternately (i.e., by operation S120 of generating active species and operation S140 of exciting the neutral molecules described above), a step coverage of the second layer L2 formed on the first layer L1 over the upper area and the lower area of the recess may be improved. That is, a second layer L2 may be uniformly formed on the first layer L1.

The layer with an improved step coverage is shown in FIG. 5, and the second layer L2 formed during operation S140 of exciting the neutral molecules N may have a uniform thickness. For example, an average thickness of the second layer L2 at the top 10% of the recess and an average thickness of the second layer L2 at the bottom 10% of the recess may both be x3. In this case, an average thickness of the entire layer in the top 10% of the recess will be x1+x3, and an average thickness of the entire layer at the bottom 10% of the recess will be x2+x3. A ratio of x1+x3 and x2+x3 may be greater than 1, which may be defined as a second thickness ratio. In addition, by repeating the process of generating active species, forming neutral molecules, and exciting the neutral molecules, it is possible to achieve a more improved step coverage compared to the conventional method in which only an operation of generating active species is applied.

In some embodiments, the substrate processing method may include applying plasma in a pulsed manner, and operation S120 of generating active species and operation S140 of exciting the neutral molecules may be implemented by the applying of plasma. During the applying of plasma, at least one of first frequency RF power (i.e., high frequency RF power) of 13 MHz or more and second frequency RF power (i.e., low frequency RF power) of 1 MHz or less may be applied.

In more detail, operation S120 of generating active species and operation S140 of exciting the neutral molecules described above may be implemented by applying plasma, and operation S130 of generating neutral molecules may be performed by stopping the plasma application. In an example, applying plasma in an operation S120 of generating active species may include an ON period and an OFF period, operation S120 of generating active species from a source gas and/or operation S140 of exciting the neutral molecules may be implemented during the ON period, and operation S130 of generating neutral molecules (i.e., the neutralizing of the active species A) may be performed during the OFF period. In particular, as an ON/OFF period of a plasma pulse is shorter, generation of active species, generation of neutral molecules, and excitation of the neutral molecules proceed almost simultaneously, which has a technical effect of forming a more uniform film almost simultaneously in upper and lower areas of a recess structure. Therefore, as shown in FIGS. 3 to 5, there is a technical effect of suppressing the formation of a thicker film in the upper area of the recess structure and achieving a more improved step coverage.

In some embodiments, the ON section in operation S120 of generating active species may be defined as a first time period, the OFF period of operation S130 of generating neutral may be defined as a second time period, and the ON section of operation S140 of exciting the neutral molecules may be defined as a third time period. In this case, in an example, the second time period may be greater than the first time period, thereby allowing more neutral molecules to be generated and move into the recess of the gap structure. In another example, the first time period may be less than the third time period, thereby minimizing an overhang portion of a layer formed during the first time period.

As described above, according to the embodiments according to the technical idea of the disclosure, by supplying plasma power in the form of a pulse so that the source gas S is diffused to the lower area of the gap structure, a film having a uniform thickness may be formed. Further, according to optional embodiments, a film formation rate may be improved by dissociating a source gas and a reactant gas together through plasma application.

Although not shown in the drawings, the substrate processing method may further include a post-treatment of a formed layer according to some embodiments. This post-treatment may be a subsequent processing operation for a formed layer, and the supply of the source gas S may be interrupted during the post-treatment. In some embodiments, during the post-treatment, the layer may be densified, or an overhang portion O' (of FIG. 5) included in the formed layers L1 and L2 may be removed.

According to an embodiment, in forming a layer by stacking layers on the surface of the gap structure, a layer is formed in a deposition operation in which a source gas, a reactant gas, and high-frequency RF power are simultaneously supplied, and then the layer is densified in a plasma post-treatment operation. In the plasma post-treatment operation, it is possible to uniformly densify from the upper area to the lower area of the gap by supplying low-frequency RF power. Through this, in a deposition process for a gap structure having a high aspect ratio, a film formation rate, a step coverage, and uniformity of film characteristics (e.g., etching characteristics) may be improved at the same time.

Figure 6:
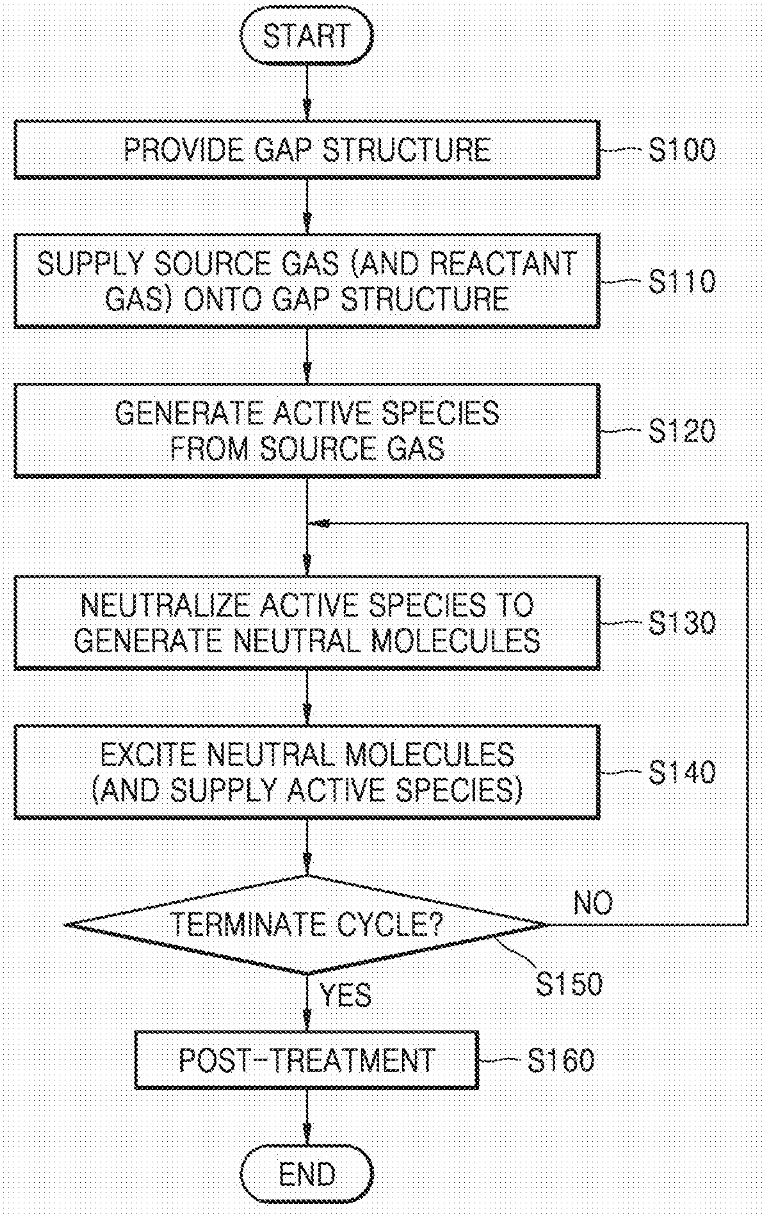
FIG. 6 is a flowchart of a substrate processing method according to embodiments.

FIG. 6 is a flowchart illustrating a substrate processing method according to embodiments. The substrate processing method according to the embodiments may be a variation of the substrate processing method according to the above-described embodiments. Hereinafter, repeated descriptions of the embodiments will not be given herein.

Referring to FIG. 6, as in the embodiment of FIG. 1, in operation S100, a gap structure is prepared, and in operation S110, a source gas (and a reactant gas) is supplied onto the gap structure. Thereafter, in operation S120, an active species is generated from the source gas so that layer formation is concentrated in an upper area of a recess, and after neutralizing the active species to generate neutral molecules in operation S130, in operation S140, the neutral molecules are excited so that the layer formation is concentrated in a lower area of the recess.

In some embodiments, operation S130 of generating neutral molecules and operation S140 of exciting the neutral molecules may be repeated several times as a layer formation cycle. After this cycle repeats a certain number of times, the layer formation cycle is terminated and operation S160 of post-treatment is performed, but if not, after operation S150 of determining whether the cycle is terminated, the number of cycles increases, and then operations S130 and S140 may be repeated. In some embodiments, a source gas may be continuously supplied during operation S140 of exciting the neutral molecules, and thus, the supply of an active species may be continued while the layer formation cycle is repeated.

After the layer formation cycle of S130 to S140 is terminated, operation S160 of post-treatment is performed. As described above, because operation S160 of post-treatment is an operation for subsequent processing of a formed layer, the supply of the source gas may be interrupted during operation S160 of post-treatment. In addition, plasma may be applied during operation S160 of post-treatment. The condition (i.e., parameters) of the plasma applied during operation S160 of post-treatment may be adjusted according to the purpose of the post-treatment.

For example, during operation S160 of post-treatment, plasma may be applied to densify a previously formed layer. In this case, RF power during operation S160 of post-treatment may be set to be greater than RF power (i.e., RF power enough to dissociate source gas molecules) during operation S120 of generating active species from the source gas. Accordingly, an ion bombardment effect by high RF power may be achieved, and as a result, smooth densification of the layer may be achieved.

In some embodiments, a RF frequency during operation S160 of post-treatment may be less than the RF frequency during operation S120 of generating active species from the source gas. For example, low-frequency RF power (e.g., RF power of 1 MHz or less) may be applied during operation S160 of post-treatment. A moving distance of an active species may increase by such low-frequency power plasma, and the active species may be moved to the lower area of the recess, thereby achieving densification of a layer in the lower area.

In a further embodiment, high-frequency RF power (e.g., RF power of 13 MHz or higher) may be applied during operation S160 of post-treatment, through which an amount of ions generated and ion density may increase, so that a large amount of ions and active species may be supplied to the recess between the first step and the second step. The frequency of the RF power applied in operation S160 of post-treatment may match the frequency of the RF power used in the layer formation cycle described above. In another embodiment, the frequency of RF power supplied during operation S160 of post-treatment may further include the plasma frequency of RF power supplied during operation S120 of generating active species from the source gas. For instance, a frequency of RF power supplied to generate active species from the source gas may be a high frequency and a frequency of RF power supplied for post-treatment may be a mixture of high frequency and low frequency. That is, a RF frequency for the post-treatment may further include a RF frequency for generating active species from the source gas in the layer forming cycle.

Figure 7:
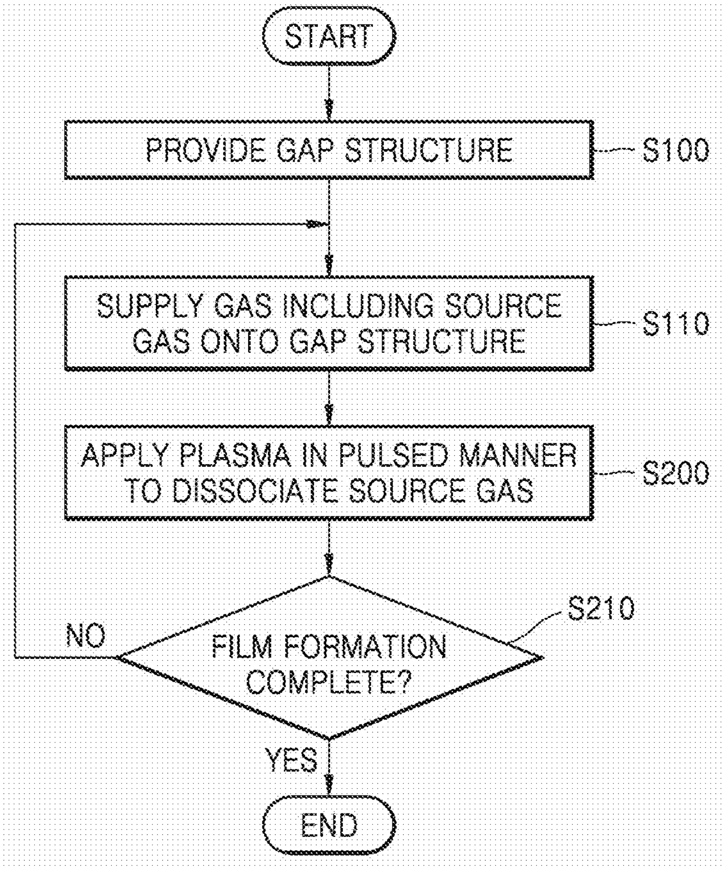
FIG. 7 is a flowchart of a substrate processing method according to embodiments.

FIG. 7 is a flowchart illustrating a substrate processing method according to embodiments. The substrate processing method according to the embodiments may be a variation of the substrate processing method according to the above-described embodiments. Hereinafter, repeated descriptions of the embodiments will not be given herein.

Referring to FIG. 7, as in the embodiment of FIG. 1, in operation S100, a gap structure is prepared, and in operation S110, a gas including a source gas is supplied onto the gap structure. Thereafter, in operation S200, a film formation process is performed by applying plasma in a pulsed manner to dissociate the source gas. The source gas dissociated by the plasma application may react with a reactant gas that is supplied simultaneously or a reactant gas that is subsequently supplied, and as a result, a layer may be formed on the gap structure. Operation S110 of supplying a gas including a source gas and operation S200 of dissociating the source gas may be repeated as a layer formation cycle. In other words, during operation S210 of determining whether the film formation is terminated, it is determined whether the layer formation cycle equals to a predetermined number of times, and if not, operations S110 and S200 may be repeatedly performed by increasing the number of cycles.

In some embodiments, pulsed plasma applied to dissociate the source gas may be configured to generate neutral ions from an active species. In addition, in some other embodiments, the pulsed plasma applied to dissociate the source gas may be configured to reduce an edge potential of an edge of a step. In a further embodiment, the pulsed plasma applied to dissociate the source gas may be configured to generate neutral ions from an active species and reduce an edge potential of an edge of a step.

Figure 8:
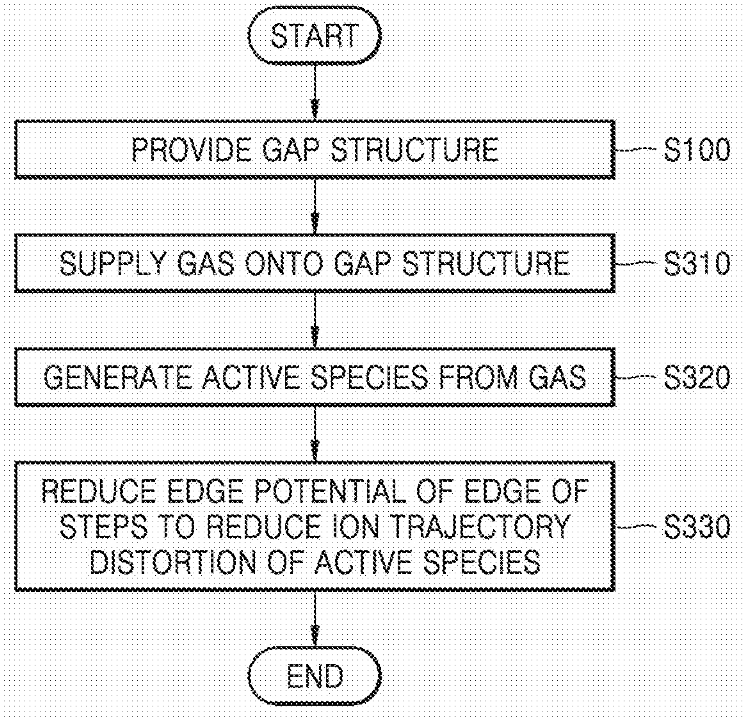
FIG. 8 is a flowchart of a substrate processing method according to embodiments.

FIG. 8 is a flowchart illustrating a substrate processing method according to embodiments. The substrate processing method according to the embodiments may be a variation of the substrate processing method according to the above-described embodiments. Hereinafter, repeated descriptions of the embodiments will not be given herein.

Referring to FIG. 8, as in the embodiment of FIG. 1, in operation S100, a gap structure is provided. Thereafter, in operation S310, a gas is supplied onto the gap structure. The gas may be a gas including a source gas. Thereafter, in operation S320, an active species is generated from the gas. The generation of such active species may be accomplished by a variety of known methods. For example, energy applied to generate the active species may include electrical energy, thermal energy, or light energy.

Thereafter, operation S330 of reducing an edge potential of an edge of steps of the gap structure is performed. By reducing the edge potential, ion trajectory distortion of the active species may be reduced. As a result, smooth migration of the active species into a lower area of a recess may be achieved. As an example of a method of reducing an edge potential of an edge of a step, a reverse potential (i.e., a positive potential) may be applied to a negatively charged substrate support unit for a certain period of time.

Figure 9:
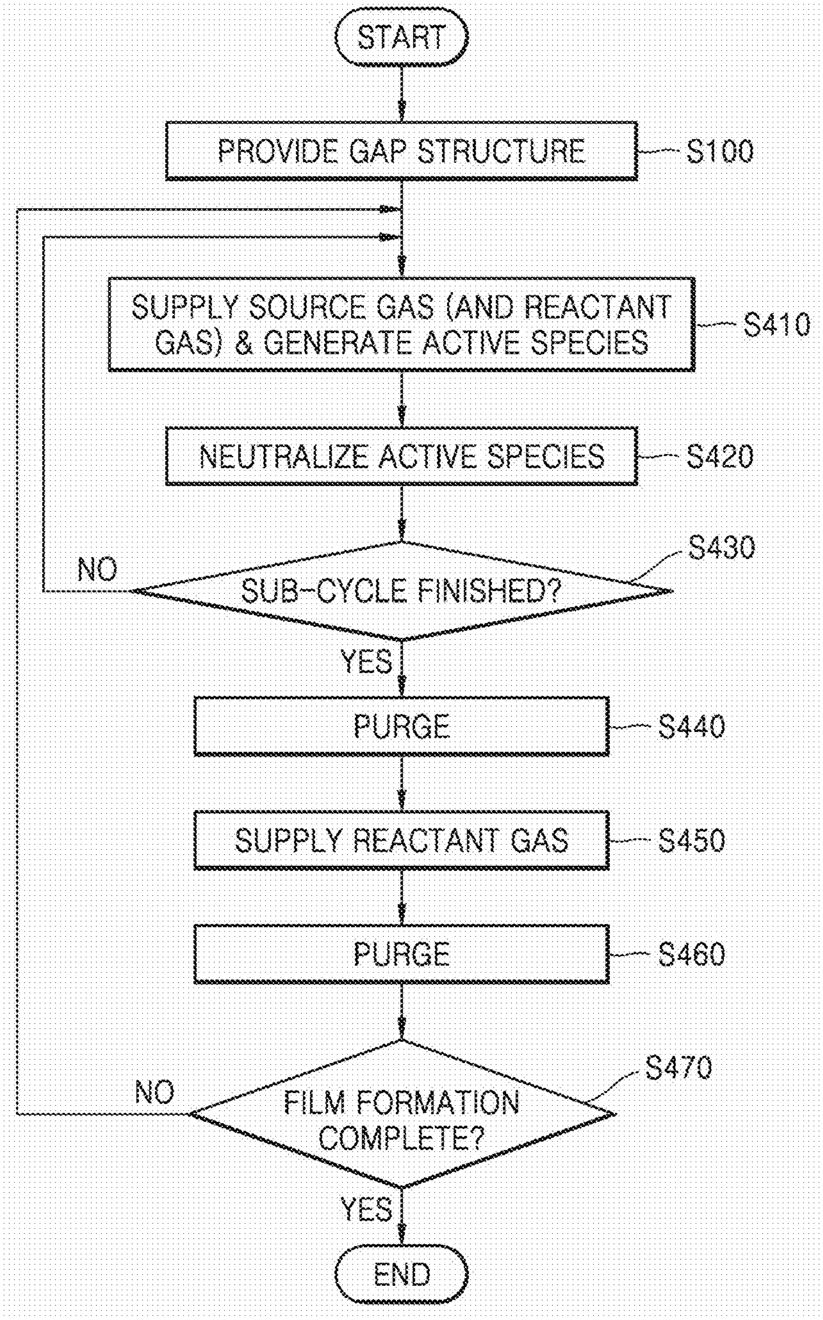
FIG. 9 is a flowchart of a substrate processing method according to embodiments of the inventive concept.

FIG. 9 is a flowchart illustrating a substrate processing method according to embodiments. The substrate processing method according to the embodiments may be a variation of the substrate processing method according to the above-described embodiments. Hereinafter, repeated descriptions of the embodiments will not be given herein.

Referring to FIG. 9, first, in operation S100, a gap structure is prepared, then a source gas (and a reactant gas or reactive purge gas) is supplied, and in operation S410, active species are generated through plasma application or the like. Thereafter, operation S420 of neutralizing the active species is performed, and a sub-cycle comprising the above-described operations S410 to S420 are repeated predetermined times to form a layer. After operation S430 of determining whether the sub-cycle is terminated, in operation S440, residual gases are purged, and in operation S450, a reactant gas or a reactive purge gas is supplied. When a reactive purge gas is supplied as described above, gases supplied during the purge operation S440 and the reactant gas supply operation S450 may be the same as each other.

During operation S450 of supplying a reactant gas, active species may be generated through plasma application or the like. Thereafter, in operation S460, the residual gases are purged, and it is determined whether film formation is terminated. When the film formation is not terminated, a sub-cycle comprising S410 to S420 may be performed again, and operation S440 of purging and operation S450 of supplying a reactant gas may be performed.

Figure 10:
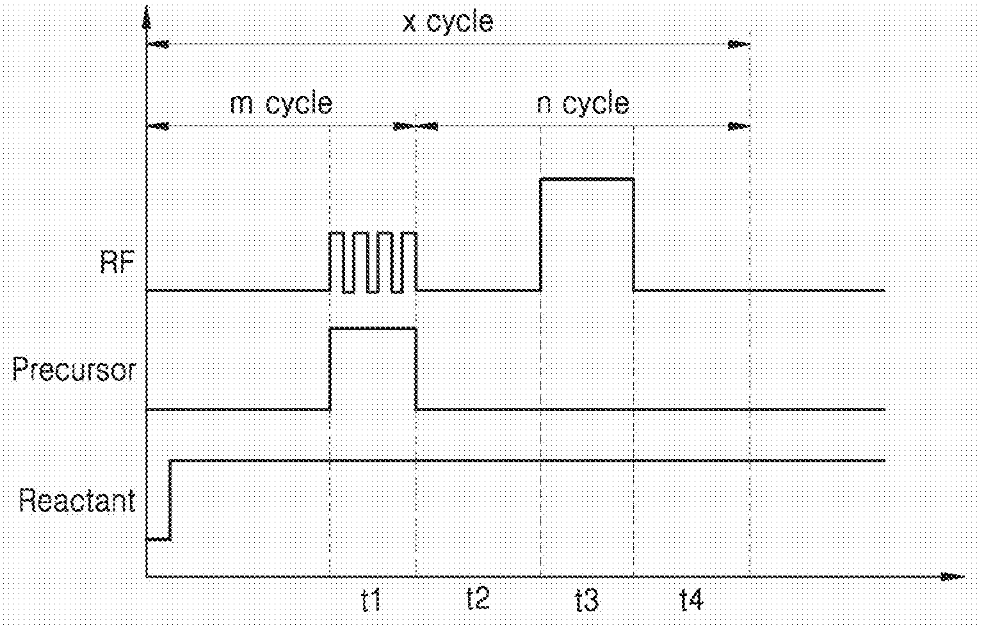
FIG. 10 is a view illustrating a gap-filling method according to embodiments.

FIG. 10 is a view illustrating a gap-filling method according to embodiments.

Referring to FIG. 10, a first step (t1) is a chemical vapor deposition step, in which a source gas, a reactant gas, and RF power are supplied together, and then a plasma post-treatment step (t3), which is a third step (t3), is performed. In the deposition step (t1), RF power is supplied in a pulsed manner (e.g. pulsed wave). Each step will be described in detail below.

First step (t1): In the first step (t1), a source gas (e.g. precursor), a reactant gas, and RF power are supplied together to a reaction space of a reactor. The RF power dissociates the source gas and the reactant gas to induce a gas phase reaction between two gas molecules to promote film formation on a substrate. However, the RF power supplied in this step is supplied with an intensity sufficient to induce dissociation of source gas molecules so that, in addition to the gas phase reaction between the source gas and the reactant gas in the reaction space, a surface reaction between the source gas molecules and the substrate also proceeds at the same time. Therefore, there is a technical effect of simultaneously improving the uniformity of a thin film deposited on the substrate while increasing a film formation rate of the thin film deposited on the substrate.

In the first step, the RF power is supplied in particular in the form of a pulse. In general, in a gap-filling process using plasma, active species or ions supplied to an inner area of a gap react first with a sidewall of an upper area of the gap where electrons are accumulated before reaching a sidewall or the bottom of a lower area of the gap. Accordingly, a film deposition rate in the lower area of the gap is less than a film deposition rate in the upper area. However, in an RF-off period of a pulse area (t1), as the active species or ions are neutralized, they may reach the lower area of the gap. In other words, by improving the mobility of ions on a surface of a gap structure, uniform film deposition is possible from an upper area to a lower area of the gap structure, and there is a technical effect of improving a step coverage on the surface of the gap structure. The RF power supplied in the first step may be supplied as high-frequency RF power (HRF), low-frequency RF power (LRF), or a combination thereof. That is, high-frequency RF power and low-frequency RF power may be supplied together with the source gas. A frequency of the high-frequency RF power may be 13 MHz or more. For example, the frequency may be 13.56 MHz, 27.12 MHz, or 60 MHz. A frequency of the low-frequency RF power may be 1 MHz or less. For example, the frequency may be 430 KHz or 320 KHz.

Figure 11:
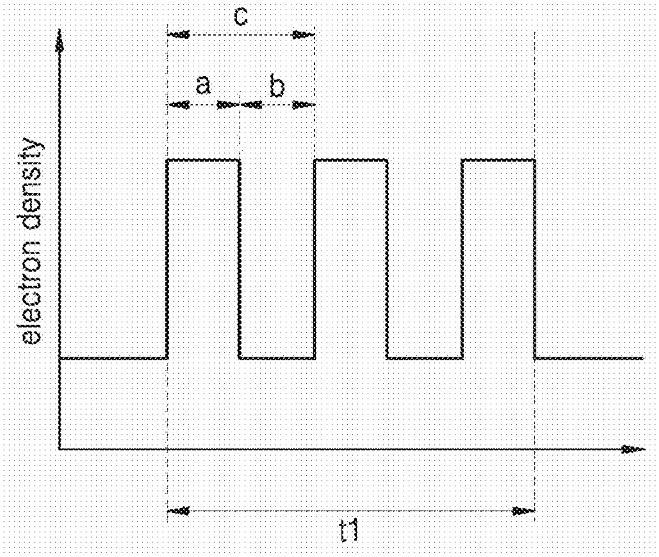
FIG. 11 is a view illustrating a first step (t1) of FIG. 10, showing the definition of a duty ratio.

In the first step, the intensity of applied RF power becomes different according to a duty ratio (a ratio of RF-on period to a pulse period including RF-on and RF-off). For example, the intensity of applied RF power when the duty ratio is large may be less than the intensity of applied RF power when the duty ratio is small. However, the intensity of the total applied RF power may be the same. For example, when the duty ratio is large, applied RF power may be small, and when the duty ratio is small, applied RF power may be large. FIG. 11 shows the definition of a duty ratio.

FIG. 11 is a view illustrating the first step (t1) of FIG. 10, showing the definition of a duty ratio. The duty ratio is expressed as a ratio of RF on time (a) to a unit period (a+b) of an RF pulse. That is, in FIG. 10, the duty ratio is defined as a/(a+b) or a/c.

Figure 12:
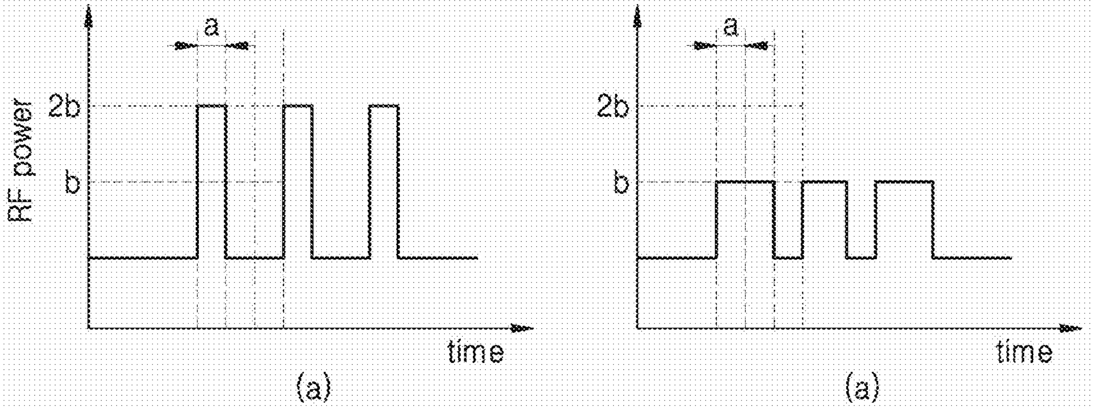
FIG. 12 is a view illustrating various types of an RF pulse according to an embodiment.

FIG. 12 shows various types of an RF pulse according to an embodiment.

Duty ratios of FIGS. 12 (*a*) and 12 (*b*) are different from each other by 1/3 and 2/3, respectively. However, the intensity of applied RF unit power is the same (RF on-time x RF power).

In addition, when RF power is supplied in the form of a pulse, ion energy is reduced, so there is a technical effect of preventing a damage to lower film. For example, in an embodiment, when RF power is supplied in a pulse mode, a loss of sub-layer (e.g. carbon loss) may be reduced by up to 75% compared to when RF power supplied in a continuous mode.

Second step (t2): the second step (t2) of FIG. 10 is a purge step in which reaction byproducts generated in the first step (t1) are removed from a reaction space.

Third step (t3): the third step (t3) of FIG. 10 is a plasma post-treating step. In this step, a thin film is densified while applying RF power to a reactant gas or a purge gas without supplying a source gas. The intensity of the RF power applied in the third step (t3) to densify the thin film may be greater than the intensity of the RF power applied in the first step (t1). As described above, a film deposited on a surface of a gap structure in the first step (t1) is formed by supplying weak RF power enough to dissociate source gas molecules, so the film is not dense. Accordingly, in the third step, high RF power is applied to densify the film by an ion bombardment effect. In particular, a moving distance of active species increases by supplying low-frequency RF power, thereby improving the uniformity of film characteristics from an upper area to a lower area of a gap. For example, there is a technical effect of improving the uniformity of the density of a formed film. Accordingly, there is a technical effect of preventing cracks due to non-uniform thermal expansion inside a film filling the gap in the subsequent annealing process.

In this step, low-frequency RF power (LRF) may be supplied, but in another embodiment, high-frequency RF power (HRF) may be supplied. Alternatively, in another embodiment, low-frequency RF power (LRF) and high-frequency RF power (HRF) may be supplied together with the source gas. Accordingly, there is a technical effect of increasing the amount of ions generated and ion density, supplying more ions and active species to the lower area of the gap, and further improving the uniformity of the density of the film from the upper area to the lower area of the gap. In another embodiment, by supplying RF power greater than the RF power supplied in the deposition step (t1), there is a technical effect of increasing the amount of ions and active species generated, and increasing the density of the film. A frequency of the high-frequency RF power may be 13 MHz or more. For example, the frequency may be 13.56 MHz, 27.12 MHz, or 60 MHz. A frequency of the low-frequency RF power may be 1 MHz or less. For example, the frequency may be 430 KHz or 320 KHz.

In addition, ion bombardment by plasma applied in this step may induce a sputtering effect on the film formed in the upper area of the gap. Thus there is a technical effect of preventing the formation of voids inside the gap by destroying a film of an overhang structure formed in the upper area of the gap by the sputtering effect to keep a width of the entrance of the gap greater than the inside of the gap. In other words, there is a technical effect of improving the uniformity of characteristics of the thin film deposited on the inner wall of the gap from the upper area to the lower area of the gap by supplying low-frequency RF power, and improving characteristics of the thin film, for example, the density, by supplying high-frequency RF power together or increasing the intensity of supplied RF power to increase the amount of ionic active species.

Fourth step (t4): the fourth step (t4) of FIG. 10 is a purge step in which reaction byproducts generated in the third step (t3) are removed from the reaction space.

The deposition steps (t1) and (t2) and the plasma post-treatment steps (t3) and (t4) of FIG. 10 are repeated at least once and a plurality of times (m and n cycles) respectively, and the deposition step and the plasma post-treatment step are repeated a plurality of times to constitute a super cycle (x cycle).

Figure 13:
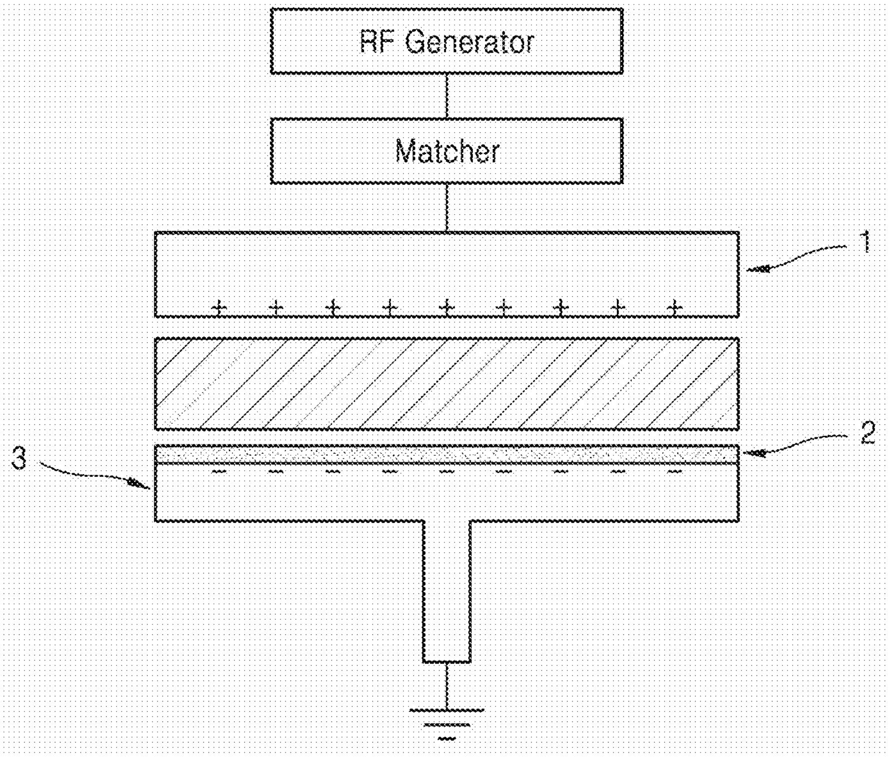
FIG. 13 is a view illustrating that a potential difference is formed in a reaction space when RF power is applied.

FIG. 13 is a schematic diagram illustrating that a potential difference is formed in a reaction space between a showerhead electrode 1 and a substrate 2 seated on a heating block 3 when RF power is applied to the showerhead electrode 1. For example, the showerhead electrode 1 may be positively charged and the opposite substrate may be negatively charged, so that a potential difference may be formed therebetween.

Figure 14:
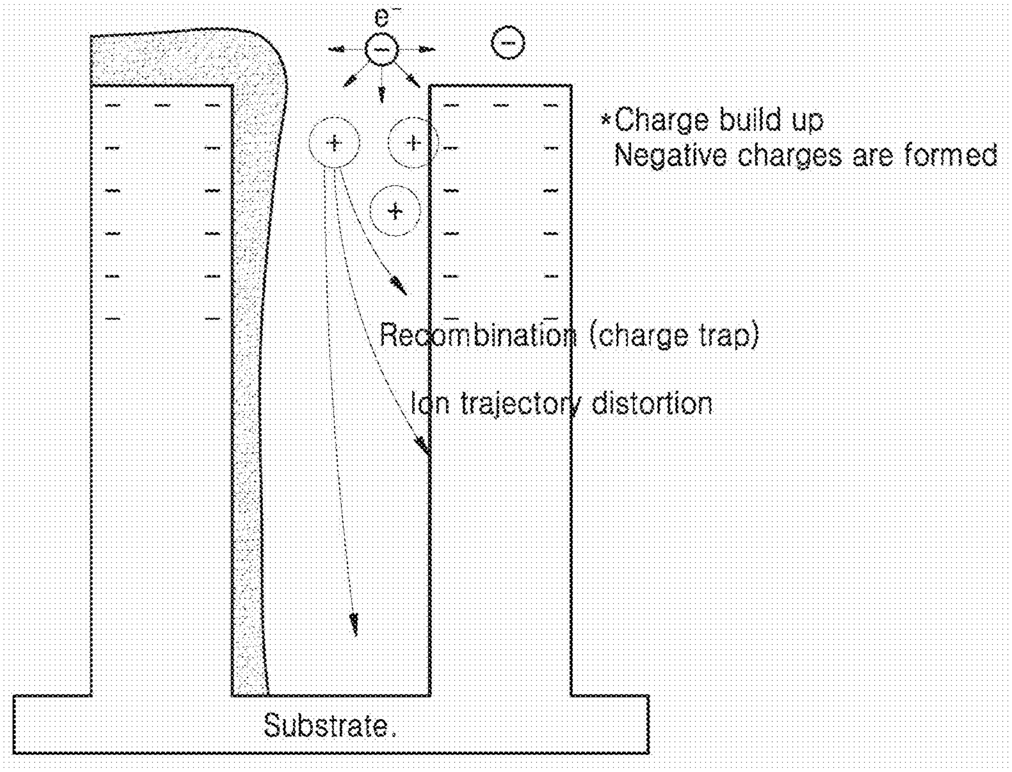
FIG. 14 is an enlarged view of a portion of a substrate of FIG. 13.

FIG. 14 is an enlarged view of a portion of the substrate 2 of FIG. 13. In FIG. 14, the substrate includes a pattern structure. Cations (e.g., dissociated source gases) and electrons are mixed in plasma, so the ion trajectory of cations may be distorted in a gap structure by the electrons (ion trajectory distortion). However, when RF power supply is interrupted in an RF-off state in the deposition step of FIG. 10, the plasma remains in a reactor (i.e. after glow), and ion energy of the residual plasma becomes low due to the interruption of the RF power supply. Therefore, the electrons are neutralized and build up on the top of the pattern structure. Ions, such as dissociated source gas molecules, are accordingly less affected by electrons and diffuse more deeply into the gap with reduced ion trajectory distortion.

Therefore, in the embodiment of FIG. 10, by supplying RF power in pulses instead of continuously, more ionic active species, such as more source gases, may be supplied to the lower area of the gap. In an embodiment, when a duty ratio is low as shown in FIG. 12 (*a*), this technical effect will become more apparent as ions are less affected by electrons and the diffusion time is extended. Of course, in such a case, the intensity of an RF power applied to increase a dissociation rate of the source gas may need to be increased correspondingly.

Figure 15:
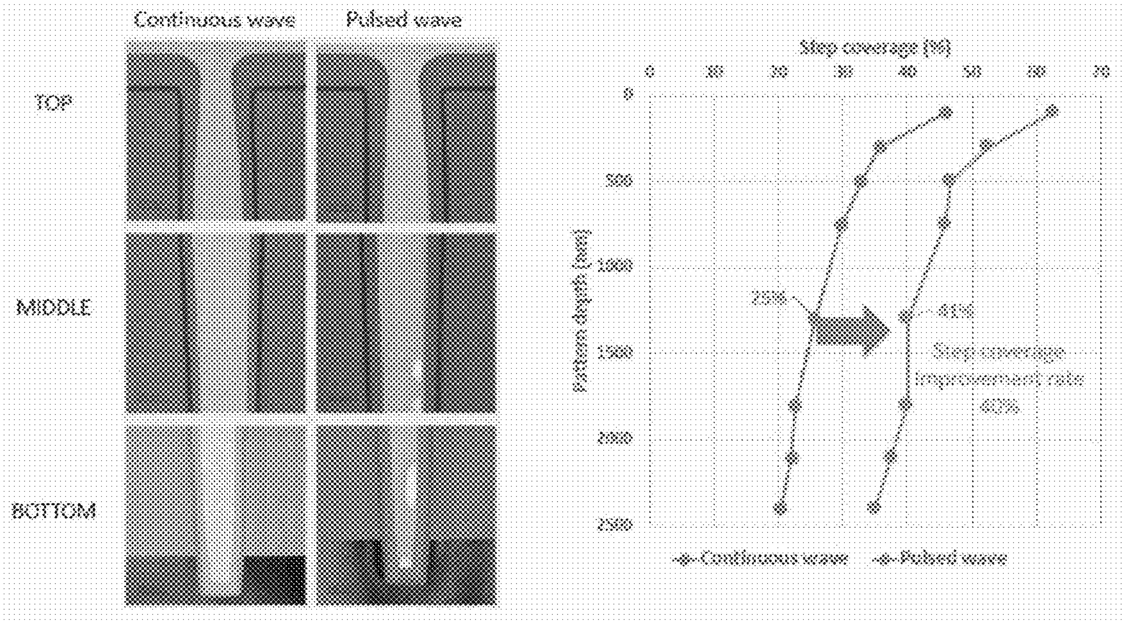
FIG. 15 is a view illustrating, in the case of performing a gap-filling process by supplying an RF power, a step coverage in each case when a $SiO_2$ film is deposited on a gap structure by a continuous method (continuous wave pulsed CVD, followed by plasma treatment) and by a pulse method (pulsed wave pulsed CVD, followed by plasma treatment)

FIG. 15 is a view illustrating, in the case of performing a gap-filling process by supplying an RF power, a step coverage in each case when a $SiO_2$ film is deposited on a gap structure by a continuous method (continuous wave mode CVD, followed by plasma treatment) and by a pulse method according to an embodiment (pulsed wave mode CVD, followed by plasma treatment).

In TEM photo of FIG. 15, when RF power is supplied in a pulsed manner, it can be seen that the thickness of a film deposited on a lower area of a gap when RF power is supplied in a pulsed manner is greater than when RF power is supplied in a continuous wave manner, and the step coverage improves by about 40% from an upper area to a lower area of the gap. FIG. 15 shows that the disclosure may be used as an insulating film between a metal film and a silicon substrate in a hole in a TSV (through silicon via) process in addition to the gap-filling process.

Figure 16:
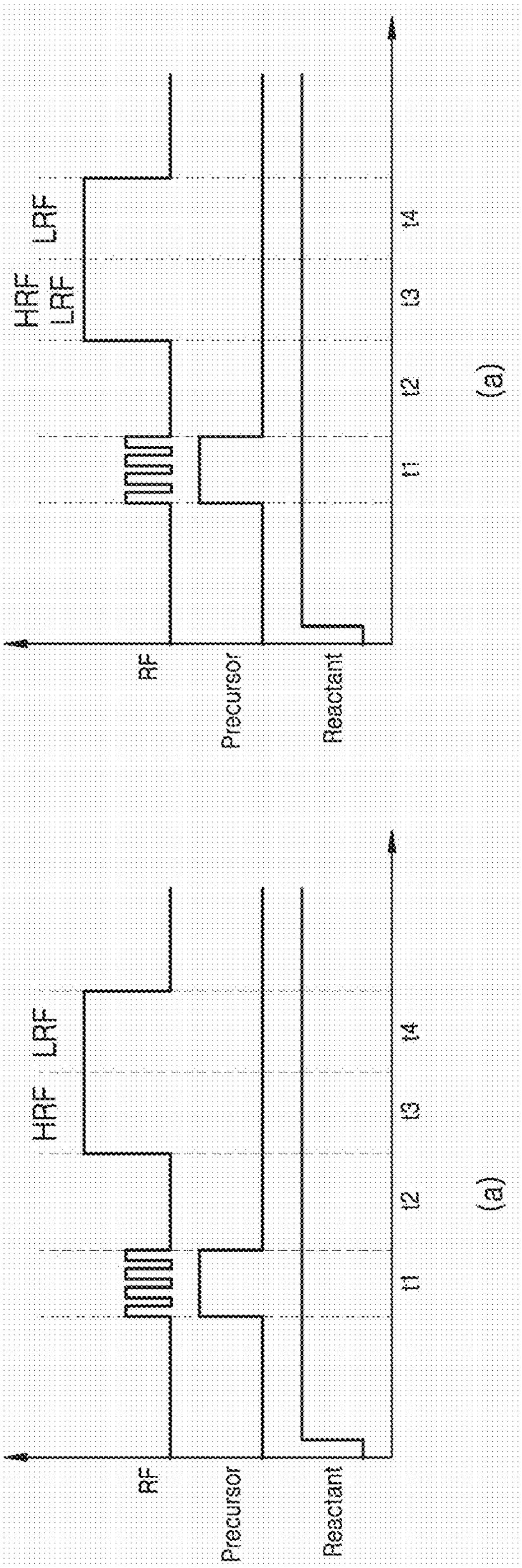
FIG. 16 is a view illustrating variant embodiments according to the disclosure.

FIG. 16 is a view illustrating a variant embodiment according to the disclosure.

FIG. 16 shows several embodiments of plasma post-treatment. For example, as shown in FIG. 16 (*a*), after increasing ion density by supplying high-frequency RF power (HRF), low-frequency RF power (LRF) may be supplied to uniformly densify a film up to a lower area of a gap structure, and thus a mean free path (MFP) of ion active species may increase. Alternatively, as shown in FIG. 16 (*b*), by supplying high-frequency RF power and low-frequency RF power together and then supplying low-frequency RF power, a film is uniformly densified up to the lower area of the gap structure while maintaining the MFP of the ion active species. In another embodiment, the intensity of RF power in respective steps of 2-step plasma post-treatment of FIG. 16 may be different.

Table 1 shows experimental conditions according to an embodiment.

| Items | | | |
| --- | --- | --- | --- |
| gas flow rate (sccm) | | Purge Ar | 500 to 10,000 (Preferably 1,000 to 7,000) |
| | | Source carrier Ar | 500 to 10,000 (Preferably 1,000 to 7,000) |
| | | O2 (reactant) | 500 to 8,000 (Preferably 1,000 to 5,000) |
| Process time (sec) | | Deposition step | 0.15 to 2.0 (Preferably 0.3 to 1.5) |
| | | Purge step | 0.20 to 1.0 (Preferably 0.3 to 0.8) |
| | | Plasma process | 0.15 to 2.0 (Preferably 0.5 to 1.5) |
| | | Purge step | 0.20 to 1.0 (Preferably 0.3 to 0.8) |
| Plasma Conditions | Deposition step | RF power (W) | 100 to 1,000 (Preferably 200 to 700) |
| | | RF frequency | HRF |
| | | Duty ratio | 0.2 to 0.8 (Preferably 0.3 to 0.7) |
| | Plasma process step | RF power (W) | 500 to 2,000 (Preferably 800 to 1,200) (for HRF) |
| | | | 100 to 1,000 (Preferably 200 to 600) (for LRF) |
| | | RF frequency | HRF, LRF |
| Process pressure | | | 1.5 Torr to 5.0 Torr |
| Process temperature | | | 50° C. to 550° C. (Preferably 300 to 550) |
| Precursor (Si source) | | | Aminosilane |

In Table 1, in the deposition step, high-frequency RF power is applied in a pulsed manner, and the duty ratio is between 0.2 and 0.8. In the plasma post-treatment step, both the high-frequency RF power and the low-frequency RF power are applied. In the example according to Table 1, a SiO2film is deposited on a gap structure, and at least one of an aminosilane-based, iodosilane-based, and halide-based source is used as the Si source. For example, a silicon source may include at least one of TSA, $(SiH_3)_3N$; DSO, $(SiH_3)_2$; DSMA, $(SiH_3)_2NMe$; DSEA, $(SiH_3)_2NEt$; DSIPA, $(SiH_3)_2N(iPr)$; DSTBA, $(SiH_3)_2N(tBu)$; DEAS, $SiH_3NEt_2$; DTBAS, $SiH_3N(tBu)_2$; BDEAS, $SiH_2(NEt_2)_2$; BDMAS, $SiH_2(NMe_2)_2$; BTBAS, $SiH_2(NHtBu)_2$; BITS, $SiH_2(NHSiMe_3)_2$; DIPAS, $SiH_3N(iPr)_2$; TEOS, $Si(OEt)_4$; $SiCl_4$; HCD, $Si_2Cl_6$; 3DMAS, $SiH(N(Me)_2)_3$; BEMAS, $SiH_2[N(Et)(Me)]_2$; AHEAD, $Si_2(NHEt)_6$; TEAS, $Si(NHEt)_4$; $Si_3H_8$; DCS, $SiH_2Cl_2$; $SiHI_3$; $SiH_2I_2$; and trimer-trisilylamine, or a derivative thereof, or a mixture thereof. The oxygen reactant gas may include at least one of $O_2$, $O_3$, $CO_2$, $H_2O$, $NO_2$, $N_2O$, or a mixture thereof. In another embodiment, a $Si_xN_y$ or SiCN film may be deposited. In this case, a reactant gas may be at least one of $N_2$, $N_2H_2$ (diimide), and $NH_3$, or a mixture thereof.

Figure 17:
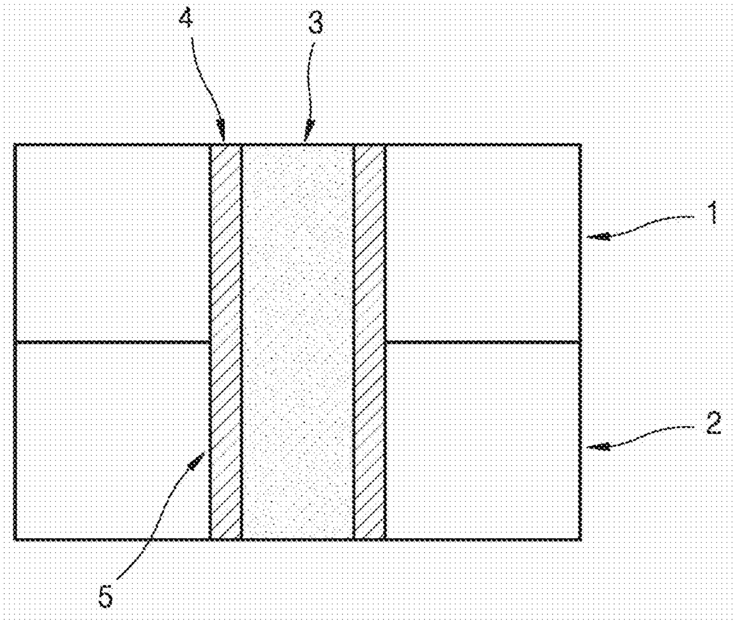
FIG. 17 is a view illustrating an embodiment in which a substrate processing method according to embodiments according to the inventive concept is applied to a TSV process.

Although the above detailed description has been described with respect to a gap-filling process, the disclosure may also be applied to a TSV process. The TSV process is a technology for increasing the degree of integration of a semiconductor device by bonding two silicon substrates, and the disclosure may be applied to a liner process for depositing an insulating film on an inner wall of a through-hole penetrating the two silicon substrates. FIG. 17 shows an embodiment of the TSV process.

In FIG. 17, a metal film 3 is filled in a through-hole 5 penetrating two substrates 1 and 2 bonded to each other, and an insulating film 4 is formed as a liner layer between the metal film 3 and an inner wall of the through-hole 5. The insulating film 4 prevents the metal film from diffusing into the substrate, and therefore needs to have a uniform thickness and uniform characteristics along the inner wall of the through-hole 5 having a high aspect ratio (HAR). Accordingly, the disclosure has a technical effect of being effectively applied to the deposition of a liner insulating film in the TSV process.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the disclosure as defined by the following claims.

What is claimed is:

1. A substrate processing method comprising:

providing a gap structure having a first step and a second step;

supplying gas including a source gas onto the gap structure;

generating active species from the source gas;

generating neutral molecules by neutralizing the active species, and moving the neutral molecules in a direction toward a lower surface of a recess extending between the first step and the second step;

exciting the neutral molecules that moved in the direction toward the lower surface; and performing post-treatment of a layer, wherein, during the post-treatment, an overhang portion of the layer is removed.

2. The substrate processing method of claim 1, wherein, during the exciting of the neutral molecules, layer formation in a first area adjacent to the lower surface of the recess between the first step and the second step is promoted.

3. The substrate processing method of claim 2, wherein, during the generating of active species from the source gas, layer formation in the second area adjacent to an edge of the first step and the second step is promoted.

4. The substrate processing method of claim 3, wherein, a step coverage of the layer formed over the first area and the second area improves by the exciting of the neutral molecules and the generating of active species from the source gas.

5. The substrate processing method of claim 1, wherein, during the neutralizing of the active species, an edge potential formed at the edge of the first step and the second step is reduced.

6. The substrate processing method of claim 5, wherein, while the neutral molecules move in the direction toward the lower surface, remaining active species move in the direction toward the lower surface without being affected by the edge potential.

7. The substrate processing method of claim 1, further comprising:

applying plasma in a pulsed manner.

8. The substrate processing method of claim 7, wherein, during the applying of plasma, at least one of first frequency RF power of 13 MHz or more and second frequency RF power of 1 MHz or less is applied.

9. The substrate processing method of claim 7, wherein the applying of plasma in a pulsed manner comprises an ON period and an OFF period, during the ON period, the generating of active species from the source gas is performed, and during the OFF period, the neutralizing of the active species is performed.

10. The substrate processing method of claim 9, wherein the exciting of the neutral molecules that moved in the direction toward the lower surface is performed during the ON period.

11. The substrate processing method of claim 1, wherein, during the supplying of gas including a source gas, a reactant gas or a reactive purge gas is supplied together with the source gas.

12. The substrate processing method of claim 1, wherein a reactant gas is continuously supplied during the supplying gas including the source gas and the performing post-treatment of the layer.

13. The substrate processing method of claim 1, wherein, during the post-treatment, the supplying of the source gas is interrupted.

14. The substrate processing method of claim 1, wherein-during the post-treatment, the layer is densified.

15. The substrate processing method of claim 1, wherein, a reactant gas is supplied subsequent to the supplying gas including the source gas.

16. The substrate processing method of claim 1, wherein RF power supplied during the post-treatment is greater than RF power supplied during the generating of active species from the source gas.

17. The substrate processing method of claim 1, wherein a RF frequency during the post-treatment is less than a RF frequency during the generating of active species from the source gas.

18. The substrate processing method of claim 17, wherein a RF frequency during the post-treatment further comprises a RF frequency during the generating of active species from the source gas.

* * * * *